United States Patent
Ito et al.

(10) Patent No.: US 7,141,798 B2
(45) Date of Patent: Nov. 28, 2006

(54) SPECTRUM MEASURING APPARATUS AND METHOD

(75) Inventors: Jun Ito, Tochigi (JP); Hajime Kanazawa, Tochigi (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/923,574

(22) Filed: Aug. 20, 2004

(65) Prior Publication Data

US 2005/0045829 A1    Mar. 3, 2005

(30) Foreign Application Priority Data

Aug. 25, 2003    (JP) ............................. 2003-299649

(51) Int. Cl.
*G01J 1/42* (2006.01)
*G01J 3/51* (2006.01)
*G21K 1/02* (2006.01)
*H05G 2/00* (2006.01)

(52) U.S. Cl. ................. 250/372; 250/504 R; 250/365; 378/158; 356/420

(58) Field of Classification Search ............... 250/372, 250/504 R, 503.1, 504 H; 356/420; 378/156, 378/157, 158

See application file for complete search history.

(56) References Cited

U.S. PATENT DOCUMENTS

| | | | |
|---|---|---|---|
| 6,421,421 B1* | 7/2002 | McGeoch | 378/119 |
| 6,636,367 B1* | 10/2003 | Drodofsky et al. | 359/823 |
| 6,657,216 B1* | 12/2003 | Poris | 250/559.22 |
| 6,825,481 B1* | 11/2004 | Miyake | 250/492.2 |
| 6,894,285 B1* | 5/2005 | Kleinschmidt et al. | 250/372 |
| 2002/0085286 A1 | 7/2002 | Drodofsky et al. | |
| 2003/0058429 A1* | 3/2003 | Schriver | 355/133 |
| 2003/0155531 A1* | 8/2003 | Clark et al. | 250/492.1 |

FOREIGN PATENT DOCUMENTS

JP    A 2002-175980    6/2002

\* cited by examiner

*Primary Examiner*—David Porta
*Assistant Examiner*—Frederick F. Rosenberger
(74) *Attorney, Agent, or Firm*—Morgan & Finnegan, LLP

(57) ABSTRACT

A spectrum measuring apparatus that includes an extinction member for decreasing a light intensity from an EUV light source, a spectrum member for extracting light with a desired wavelength band from the decreased intensity light and a detector for detecting a light intensity of the light with a desired wavelength band is disclosed. Then, a spectrum intensity distribution (spectrum) is obtained by (a) a plural opening is located in the extinction member, and the light from the EUV light source passes through the plural opening at the same time, or (b) the detector detects the light volume of the light with a desired wavelength band as thermal energy.

8 Claims, 13 Drawing Sheets

PRIOR ART

SPECTRUM MEASURING APPARATUS AND METHOD

BACKGROUND OF THE INVENTION

The present invention relates to a spectrum measuring apparatus that measures spectrum intensity of wide wavelength of a vacuum ultraviolet region to an infrared region that irradiated from an EUV light source.

Conventionally, in photolithography process to manufacture fine semiconductor devices such as semiconductor memory and logic circuit, a reduction projection exposure that uses ultraviolet light is done. The minimum critical dimension transferred by the projection exposure is proportional to the wavelength of light used for transfer and inversely proportional to the numerical aperture ("NA") of the projection optical system. Therefore, to transfer the fine circuit pattern, shorter ultraviolet light wavelengths have been proposed—from an ultra-high pressure mercury lamp (i-line with a wavelength of approximately 365 nm) to KrF excimer laser (with a wavelength of approximately 248 nm) and ArF excimer laser (with a wavelength of approximately 193 nm).

However, lithography using ultraviolet light has limitations when it comes to satisfying the rapidly promoted fine processing of a semiconductor device. Therefore, a reduction projection optical system using extreme ultraviolet ("EUV") light with a wavelength of 10 to 15 nm shorter than that of the ultraviolet has been developed to efficiently transfer very fine circuit patterns of 100 nm or less. FIG. 11 is a conceptual rendering of the exposure apparatus that uses the EUV light.

The EUV light source uses, for example, a light source of laser plasma (LPP) method or a light source of discharge plasma (DPP) method.

The EUV light source of LPP method irradiates a highly intensified pulse laser beam to a target material put in vacuum, thus generating high-temperature plasma for use as EUV light with a wavelength of about 13 nm emitted from this. The target material may use a metallic thin film, inert gas, and droplets, etc., and is supplied by a means such as a gas jet in the vacuum. The pulse laser preferably has high repetitive frequency, e.g., usually several kHz, for increased average intensity of the emitted EUV light from the target.

On the other hand, the EUV light source of DPP method flows a gas such as Xenon between electrodes, generates the plasma with the electrical discharge, and generates the EUV light.

When the EUV light used for the exposure, the EUV light is absorbed by using a usual metallic mirror and a lens made of quartz etc. A multilayer mirror that laminates 20 layers with a molybdenum (Mo) layer and a silicon (Si) layer is used for the EUV light. In general, the multilayer mirror is adjusted by changing the thickness of the each layer of the multilayer so that reflectivity to the EUV light with a wavelength of 13.5 nm is high, and the EUV light with other wavelengths are absorbed by the mirror.

An optical system for the EUV exposure apparatus is composed with several multilayer mirrors. Especially, the EUV light source of LPP method arranges a condenser mirror surrounding the emission point to efficiently use the EUV light emitted from the target, and to condense the generated EUV light to a predetermined light wavelength.

The light emitted from the target includes not only the EUV light with the specific wavelength used for the exposure from the EUV light source of laser plasma method but also the light with a wavelength band such as the EUV light, X-ray, ultraviolet light, visible light and infrared light. Thereby, the EUV light with a wavelength different than the specific wavelength and X-ray light that can not be reflected by the multilayer mirror are absorbed by the multilayer mirror, and causes the rise in heat of the mirror. Moreover, the ultraviolet light activates a residual gas in the vacuum, and accelerates a deposition of a contamination on the condenser mirror. The light of the ultraviolet region to the infrared region is reflected by the multilayer mirror that composes the optical system of the exposure apparatus, and reaches a wafer. The light of the ultraviolet region to the infrared region is absorbed by resist, and heat expands the wafer. As the result, there is a possibility of decreasing overlay accuracy during exposure.

Therefore, it is necessary to measure the wide band spectrum of the light emitted from the EUV light source, and to measure the light intensity of the light discharged in each wavelength region precisely, to design the exposure apparatus that uses the EUV light and exposure.

An apparatus that is described to FIG. 12 is disclosed in Japanese Laid-Open Patent Application No. 2002-175980 (correspond with U.S. Patent Publication No. 2002/085286) about the measurement of the EUV light emitted from the EUV light source. In FIG. 12, the EUV light emitted from a condenser point 101 decreases the intensity of the light by an aperture stop 105, and reflects with a multilayer mirror 102. Moreover, the EUV light reaches a CCD array 104 through an EUV filter 103 that transmits only an EUV light of a target for the measurement and is measured.

Details of spectrum of the EUV light of a predetermined wavelength region can be measured by a grazing incidence spectrum system shown in FIG. 13. This method uses the multilayer mirror as the filter, e.g., two multilayer mirrors 201 and 202. The system can measure the wavelength region of about 5 to 50 nm, and can measure detail spectrum shape because it adjusts a wavelength resolution ($\lambda/\Delta\lambda$) to 500 or more.

However, the above-mentioned measuring apparatuses comparatively measure only a part of the light emitted from the EUV light source for the wavelength region in the narrow range. Thereby, it is difficult to measure the entire wide band spectrum of the light emitted from the EUV light source, and to know the absolute intensity. As the result, the wavelength intensity distribution of entire beams including the infrared ray region emitted from the EUV light source necessary to design the exposure apparatus that uses the EUV light and exposure stability can not be obtained.

BRIEF SUMMARY OF THE INVENTION

Accordingly, it is an exemplary object of the present invention to provide a spectrum measuring apparatus that can obtain spectrum intensity distribution of light emitted from an EUV light source.

A spectrum measuring apparatus of one aspect of the present invention includes an extinction member for decreasing the intensity of the light emitting from an EUV light source, a spectrum member for selecting a light with a desired wavelength band from the decreased intensity light and a detector for detecting a light volume of the light with a desired wavelength band. Then, it characterizes in (a) a plural opening is located in the extinction member, and the light from the EUV light source passes through the plural opening at the same time, or (b) the detector detects the light volume of the light with a desired wavelength band as thermal energy.

Other objects and further features of the present invention will become readily apparent from the following description of the preferred embodiments with reference to the accompanying drawings.

DETAILED DESCRIPTION OF THE PREFERRED EMBODIMENTS

The First Embodiment

The instant embodiment explains a spectrum measuring apparatus that can obtain a wavelength intensity distribution of entire beams emitted from an EUV source and the measuring procedure that uses it.

Figure 1:
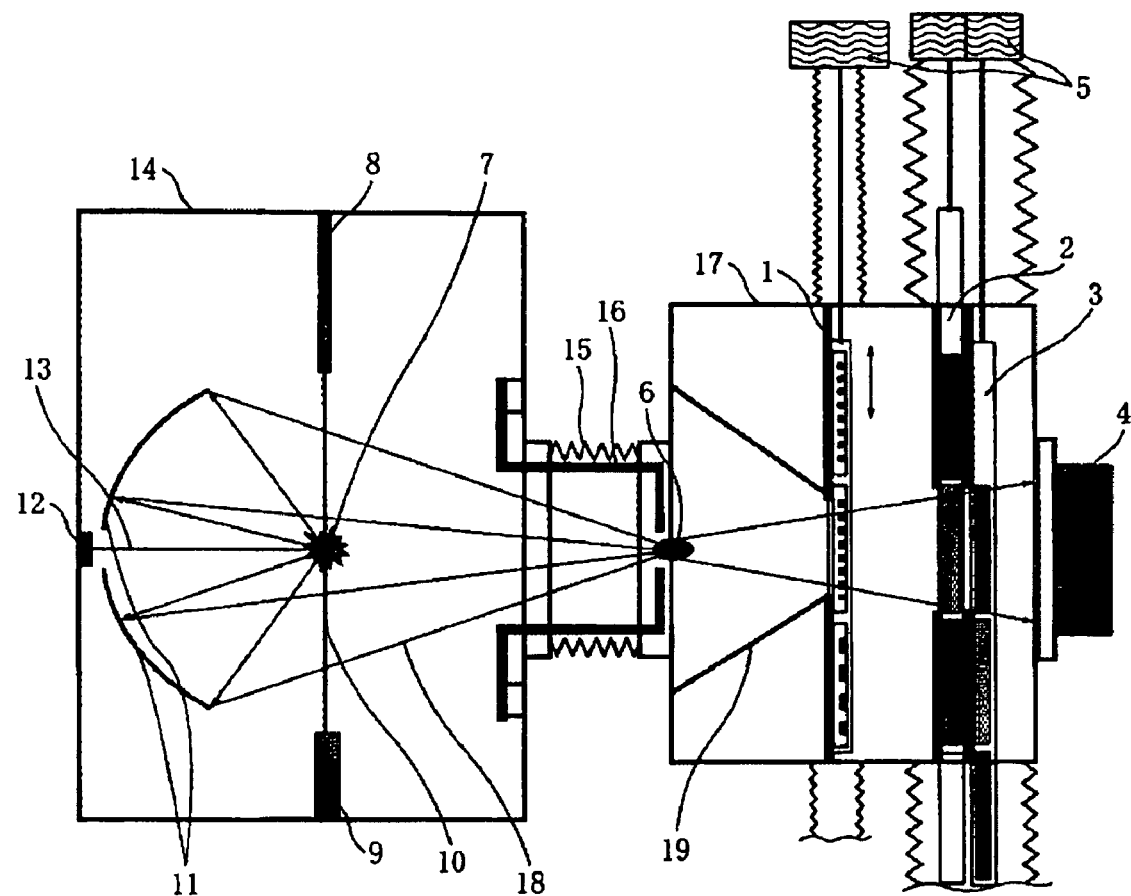
FIG. 1 is a schematic view of a spectrum measuring apparatus of the first embodiment according to the present invention.

FIG. 1 is a schematic view of measuring a light intensity of a laser plasma light source, that is one example of EUV light source, by the spectrum measuring apparatus according to the present invention.

In a measurement chamber 17 of the spectrum measuring apparatus, an incident beam 18 from an EUV light source that passes through an aperture 16 decreases in light intensity by an pinhole array 1 where a lot of pinholes are located, and after passing a filter 2 and filter 3 to select a wavelength of the measured beam, is incident in a light intensity detector 4. The EUV light is partially absorbed by a gas molecule that exists in the measurement chamber 17, and attenuates. Therefore, it is desirable to exhaust in the measurement chamber 17 to high vacuum to increase the measurement accuracy.

Figure 2:
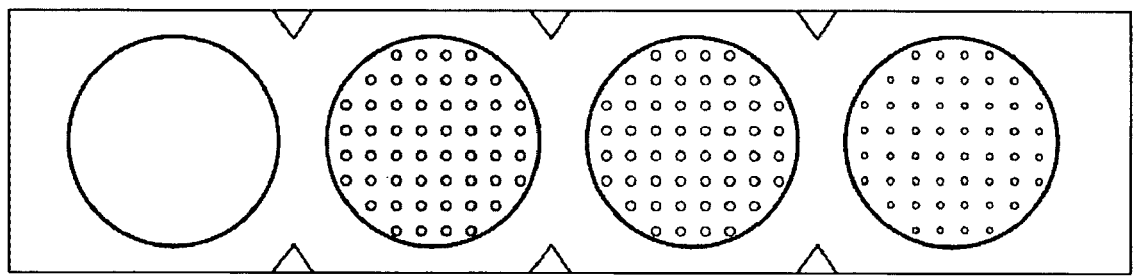
FIG. 2 is one example of arranging a pinhole array used for the spectrum measuring apparatus of the first embodiment according to the present invention.

The pinhole array 1 has a function to adjust the almost all incidence beam in the measurement chamber 17 to suitable light intensity for the measurement. FIG. 2 is shown that one example of the pinhole array 1. The plural pinhole array 1 as shown in FIG. 2 are housed in the measurement chamber 17 selectable, and can attenuate the incidence beam from the EUV light source to predetermined ratio as for example $\frac{1}{10}$, $\frac{1}{100}$, $\frac{1}{1000}$. Moreover, it is also possible to pass the all intensity incidence beam without attenuation. The pinhole array 1 is switched by moving the pinhole array 1 by a motor 5. The attenuation factor with the pinhole array 1 switches according to the maximum output of the measured light source and kind of the light source (LPP method and DPP method etc.) used, and is adjusted to suitable light intensity for the measurement by the measuring apparatus as noted above.

Figure 3A:
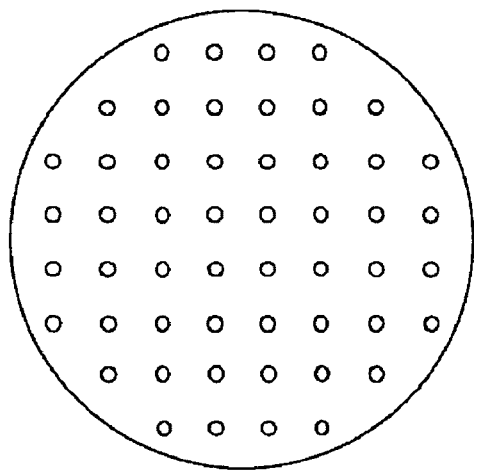
FIG. 3 is one example of a pattern of the pinhole array used for the spectrum measuring apparatus of the first embodiment according to the present invention.
Figure 3B:
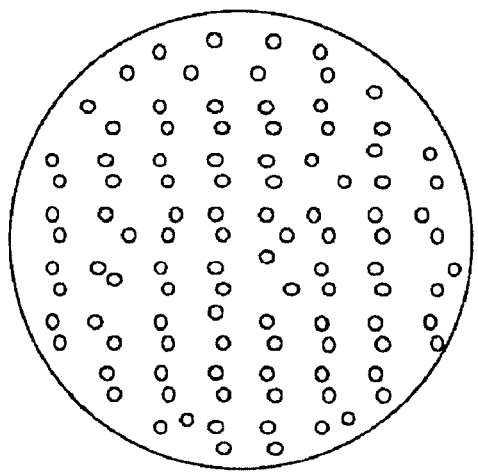
Figure 3C:
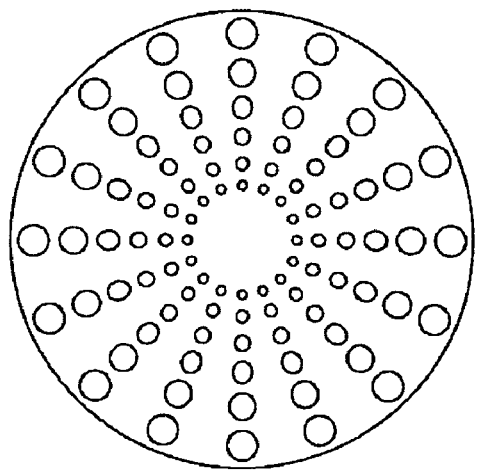
Figure 4:
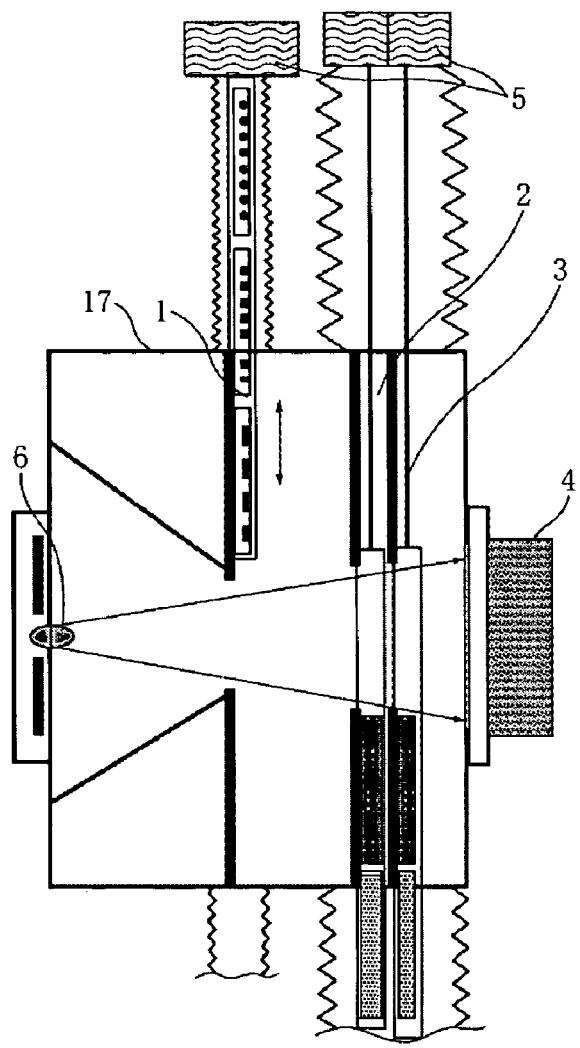
FIG. 4 is a schematic view of a state in a measurement process by the spectrum measuring apparatus of the first embodiment according to the present invention.

FIG. 3 shows an example of an array pattern of the pinhole array 1. FIG. 3A is a pattern of same diameter hole by the overall even pitch, FIG. 3B is a random pattern, and FIG. 3C is a pattern evenly arranged in a direction of the diameter in consideration of the shape of the condenser mirror. The pattern of these pinhole arrays are selected so that the light that passed the pinhole array 1 is not causing an unnecessary diffraction etc. and the beam never locally concentrates on the filter 2 and 3, or the light intensity detector 4. The numerical rate (e.g., a rate that the light passes through the array) is selected so that it is adjusted to suitable light intensity for the measurement by the measuring apparatus latter part. FIG. 4 shows the state when the pinhole array 1 is not used. When the beam from the EUV light source has a low intensity, as shown in FIG. 4, it measures without attenuating the beam by the pinhole array 1.

It is desirable to redirect the emitting light to the filter 2 and 3 or the detector 4 by considering the distance with the pinhole array 1 and the filter 2 and 3 or a receiving inspection plane of the pinhole array 1. It is desirable that the diameter of the pinhole is larger than the measured wavelength because there is maximum wavelength of light that cannot pass through the pinhole array 1. Therefore, it is desirable to have the pinhole diameter ten times larger or more than the wavelength.

For example, the detector 4 of the instant embodiment uses a calorie meter that detects the light intensity as thermal energy. When measuring the beam with a wavelength $\lambda=10$ μm near the upper bound of the detection wavelength of the calorie meter, if the distance L with the receiving inspection plane of the detector 4 is 40 mm, the shade off amount (e.g., amount of "shade off" or shadow) on a focus plane (detection plate) becomes 2.9 mm by using the pinhole array 1 (hole diameter d=$\phi$0.14 mm), and it is enough to prevent that the beam locally concentrates on the light volume detector 4. The pinhole diameter of $\phi$0.14 mm does not interrupt the beam because the pinhole diameter is sufficiently larger than the measured wavelength $\lambda=10$ μm.

The filters 2 and 3 are used to combine one or two filters if necessary, and to pass only the beam with the measured wavelength band. It is effective to change a material and a thickness etc. of the filter to select the wavelength band of the passed beam. The material of the filter is selected from $CaF_2$ (fluorite), $MgF_2$ (magnesium fluoride), ZnSe (zinc selenide), Si, Thallium-Bromide Chloride and optical glass that contain a material that absorbs light below a specific wavelength region.

There is a mechanism to arrange the filters 2 and 3 in the measurement chamber 17, and the filter that passes the desired wavelength band to be measured and the state that the filter is not used can be selected by the motor 5.

Figure 5:
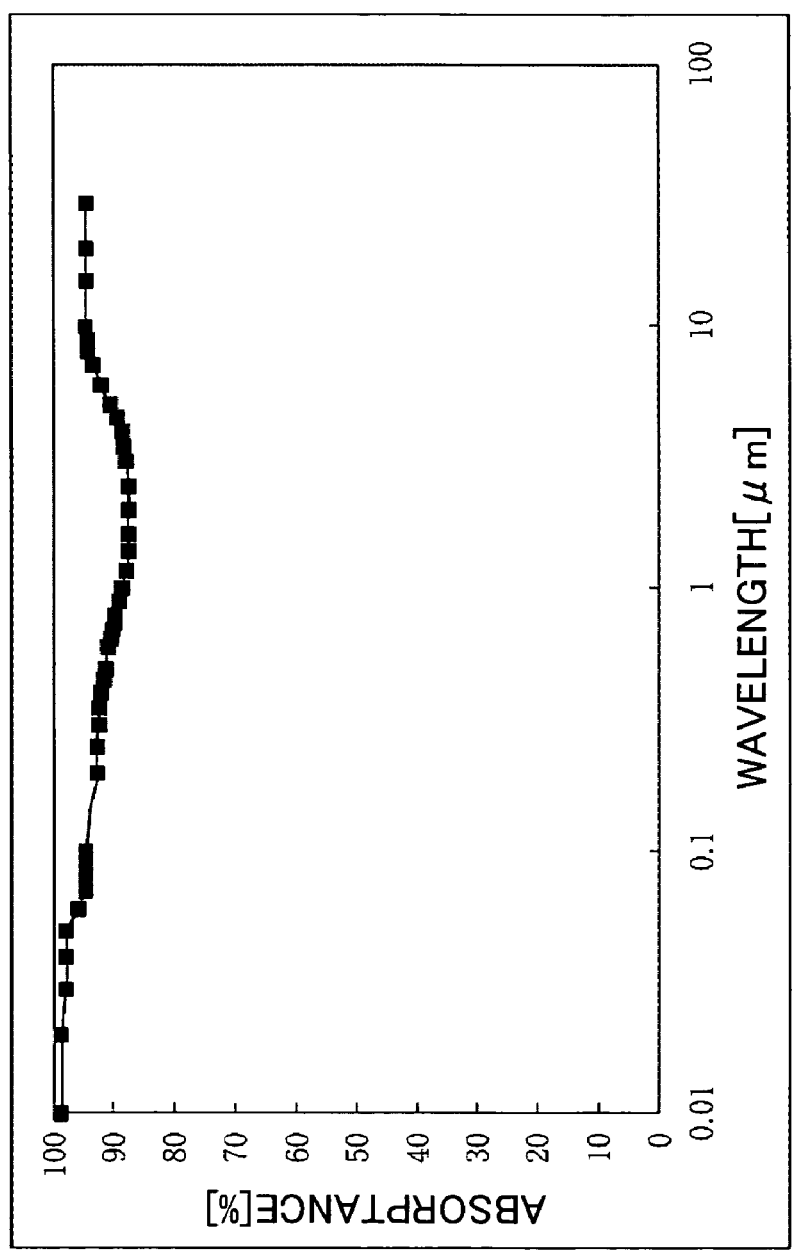
FIG. 5 is a graph that shown a light absorptance of a detector used for the spectrum measuring apparatus of the first embodiment according to the present invention.

After attenuating by the pinhole array 1 and the specific wavelength is cut out by the filter 2 and 3, the light intensity of the incidence light are measured with the detector 4. FIG. 5 shows the absorptance of each wavelength of the calorie meter used by the instant embodiment. As shown in FIG. 5, the calorie meter can absorb light with the absorptance of 90% or more in the wide wavelength band, and measure the light intensity. A CCD and a photodiode etc. can be used for others as the detector.

The cooling apparatus to keep below a predetermined temperature is located in a part that light is irradiated from the EUV light source such as the aperture 16, the pinhole array 1, filter 2 and 3, the detector 4 mentioned above. A chamber inner wall 19 is coated by a material that absorbs light easily to suppress a diffuse reflection of the light (especially, infrared light) that is reflected by the pinhole array 1. If a reflection coefficient of the chamber inner wall is about 0.1 or less toward the measured light with all wavelength bands, the measuring error by the diffuse reflection is in an allowed range.

In FIG. 1, a structure of the EUV light that the spectrum is measured by the spectrum measuring apparatus of the instant embodiment according to the present invention is as follows. However, the spectrum measuring apparatus according to the present invention can be applied also to an EUV light source that has a structure different from the EUV light source shown in FIG. 1.

In the EUV light source shown in FIG. 1, a nozzle 8 that supplies a target 10 (for example, Xenon etc.) in an EUV light source chamber 14 is located, and the target 10 is supplied. The target 10 generates a plasma 7 with a pulse laser 13 that is emitted from a laser generation apparatus 12 and condenses on the target 10, and radiates the beam including the EUV light. The radiated light includes, besides the EUV light used for the exposure, the light of wavelength band in large range such as the EUV light outside the band, X-ray, ultraviolet light, visible light, infrared light. The majority of the target 10 used to generate the plasma is collected by a target collection mechanism 9, and taken out outside of the chamber.

The EUV light with wavelength used for the exposure that is radiated from the plasma 7 is condensed by a condenser mirror 11 of spheroid to improve the use efficiency. The condenser mirror 11 generally uses the multilayer mirror that has a silicon layer and molybdenum layer of a certain film thickness where the reflectivity becomes the maximum for EUV light of wavelength used for projection exposure are alternately formed by already-known method.

Therefore, the part of the light radiated from the plasma 7 is absorbed by the condenser mirror 11 composed of the above-mentioned multilayer mirror without reflecting, and the light measured by the spectrum measuring apparatus according to the present invention is the light that is reflected by the condenser mirror 11.

In the EUV light source shown in FIG. 1, the condenser mirror 11 is composed of spheroid shape, makes the position in which the plasma 7 is generated the other focus, and condenses the reflection light in the condenser point 6. The spectrum measuring apparatus according to the present invention can be applied also to the EUV light source, for example, that radiate a parallel light according to a structure different from the EUV light source shown in FIG. 1.

The EUV light source chamber 14 is connected with the measurement chamber 17 by a bellows 15. Moreover, the aperture 16 forms a transmission part near the condenser point 6. The aperture 16 is located for the purpose to reduce the inflow of the gas from the EUV light source chamber 14 to the measurement chamber 17, because of it is desirable that the EUV light source chamber 14 is maintained about 10 Pa of pressure that is higher than the measurement chamber 17 of the spectrum measuring apparatus to reduce a pollution and a damage of the condenser mirror 11 by a dispersion material from the plasma 7.

Thereinafter, a description will be given of spectrum measuring method by the spectrum measuring apparatus shown in FIG. 1.

First, all light volume of light from the EUV light source is measured. FIG. 4 shows the state of the spectrum measuring apparatus when the all amount of the light from the EUV light source is measured. To measure the all amount of the light from the EUV light source, as shown in FIG. 4, the pinhole array 1 and the filter 2 and 3 are removed, and the light is detected by the detector 4.

The detector 4 used by the instant embodiment is the calorie meter, has detection sensitivity shown in FIG. 5. In other words, the detector 4 has the sensitivity that can detect 95% or more in the band of wavelength 100 nm or less, about 100% in the EUV light with wavelength of 13.5 nm, 88% or more in the minimum part of the long-wavelength band, and about 93% in the average. Moreover, because the detector 4 has the sensitivity to wavelength of about 30 μm on the long-wavelength band side, an all light volume Wt that is almost all of the light radiated from the EUV light source is detected by the calorie meter. An absolute light intensity is obtained by correcting the detection result by using the absorptance to the wavelength of the calorie meter shown in FIG. 5.

In the instant embodiment, the pinhole array 1 is removed and the all light intensity Wt is measured. However, when the light intensity from the EUV light source is large and exceeds a capacity of the calorie meter, it may be measured by using the pinhole array 1 that has suitable attenuation factor.

Figure 6:
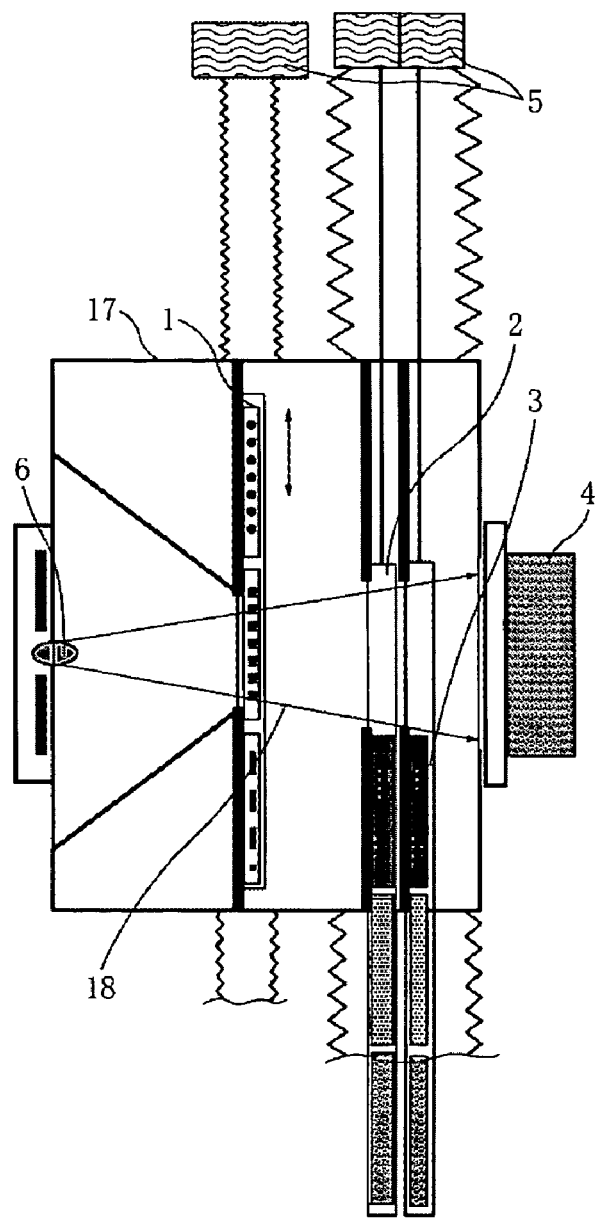
FIG. 6 is a schematic view of a state in a measurement process by the spectrum measuring apparatus of the first embodiment according to the present invention.

Next, the pinhole array 1 is selected based on detected all light intensity Wt. to attenuate the light intensity so that the filter 2 and 3 used for later are not damaged. FIG. 6 shows the state of the spectrum measuring apparatus when the pinhole array 1 that has an extinction rate of ¹⁄₁₀₀ is selected. It is desirable to measure the light intensity from the EUV light source without using the filter 2 and 3 to confirm the accurate attenuation factor of the selected pinhole array 1 as shown in FIG. 6. When the light intensity detected by the detector 4 via the pinhole array 1 decreases to the light intensity Wp1 by measuring, shown in FIG. 6, the actual extinction rate of the pinhole array 1 can be obtained by Wp1/Wt.

Figure 7:
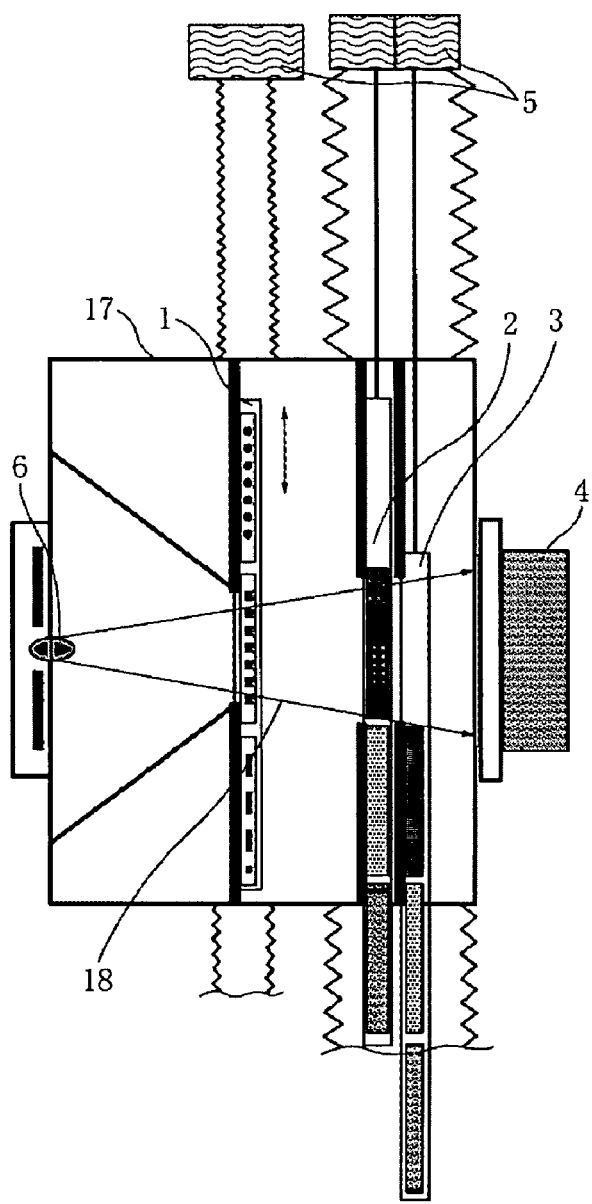
FIG. 7 is a schematic view of a state in a measurement process by the spectrum measuring apparatus of the first embodiment according to the present invention.
Figure 8:
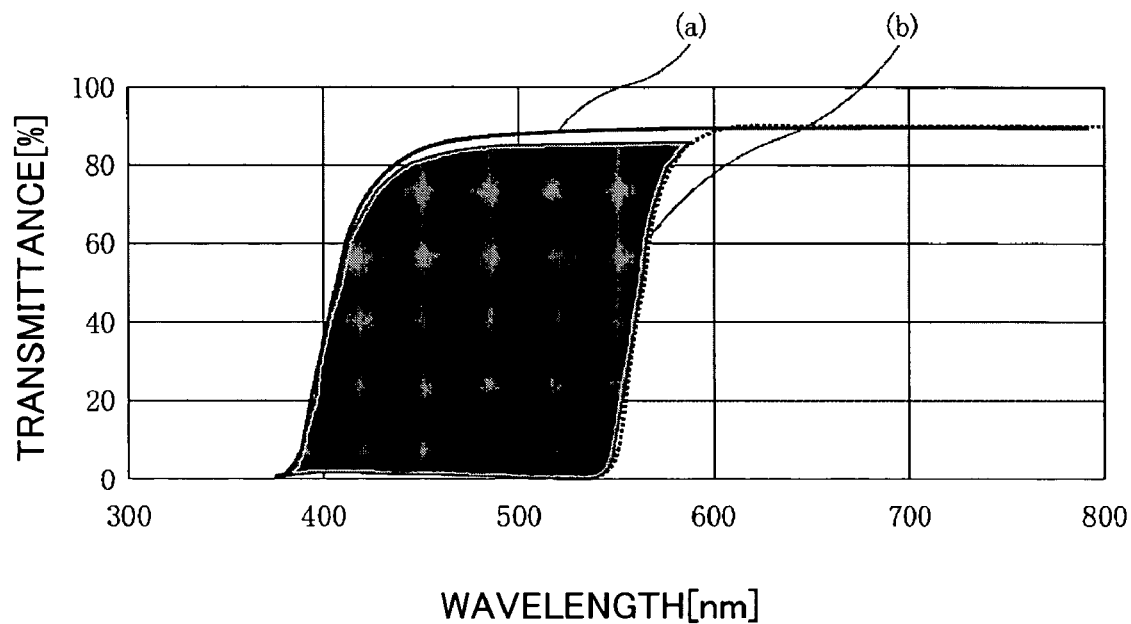
FIG. 8 is a graph that shown a transmittance of a filter used for the spectrum measuring apparatus of the first embodiment according to the present invention.

Next, the light intensity is measured in each frequency band. FIG. 7 shows the state that the pinhole array 1 that has the extinction rate of ¹⁄₁₀₀ and the one filter 2 that the absorption edge is an already-known filter insert in an optical path to measure the light intensity of the specific wavelength band. A filter a that shuts out light with the wavelength region of 390 nm or less is used as one example of the filter 2 in FIG. 7. FIG. 8 shows absorption characteristics of the filter a and the filter b. The filter a has the transmittance only for the light with the wavelength region of 390 nm or more as shown in FIG. 8. For example, a general optical glass filter like the sharp cut filter made by SHIGMA KOKI CO., LTD. can be used as the filter a and filter b.

When irradiating the light from the EUV light source while shown in FIG. 7, the light intensity Wf1' to which the wavelength band that is attenuated by the pinhole array 1, and cut out by the filter a is decreased. The light intensity Wf1' is the light intensity in the wavelength region of 390 nm or more, the light intensity Wf1 of light with the wavelength region with 390 nm or more is obtained by considering the transmittance of the filter a in the region and the sensitivity of the detector 4.

Next, in the filter a exchange with a filter b that shuts out the light below the wavelength region of 560 nm, and the similar measuring, a light intensity Wf2' is detected by the detector 4. The light intensity Wf2' is the light intensity in the wavelength region of 560 nm or more, the light intensity Wf2 of light with the wavelength region with 560 nm or more is obtained by considering the transmittance of the filter b in the region and the sensitivity of the detector 4. Moreover, the subtraction of the light intensity Wf1 and the light intensity Wf2 becomes the light intensity Wf of 390 nm to 560 nm under the existence of the pinhole array 1, and the absolute light intensity If1 of the wavelength band of 390 nm to 560 nm that be reflected from the EUV light source is obtained by considering the extinction rate F of the pinhole array 1.

As an example of other materials used, as the filter 2, it is possible to use the filters of ZnSe (zinc selenide) or Si (silicon) of 5 mm thickness. In this case, ZnSe transmits the light with wavelength of 0.6 μm or more to 20 μm, and Si transmits the light with wavelength of 1.2 μm or more to 15 μm. The light with wavelength of 15 to 20 μm can not be substantially detected by the detector 4. Thereby, the absolute light intensity of light with wavelength of 0.6 μm to 1.2 μm is obtained by using the above-mentioned filter.

As mentioned above, measuring the light intensity in each part of the spectrum distribution of light from the EUV light source becomes possible by switching to the filter that has the absorption range in the measured wavelength band. As the result, the spectrum distribution and absolute intensity of the entire emitting light can be decided by considering these.

The Second Embodiment

Figure 9:
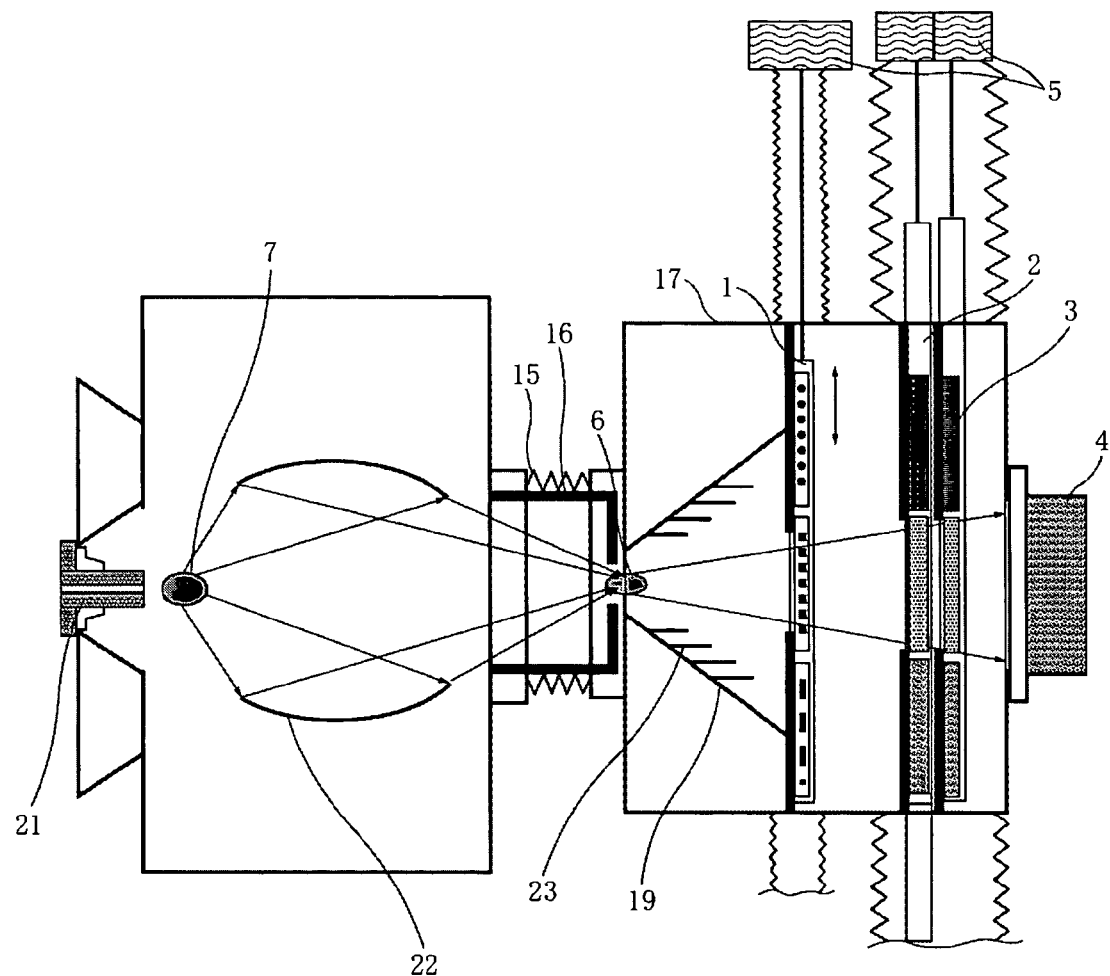
FIG. 9 is a schematic view of a spectrum measuring apparatus of the second embodiment according to the present invention.

FIG. 9 shows a spectrum measuring apparatus of the second embodiment according to the present invention. FIG. 9 shows the state to apply the spectrum measuring apparatus according to the present invention to the discharge method plasma light source (DPP) that is one method of EUV light source. The instant embodiment chiefly explains a point different from the first embodiment.

The discharge method plasma light source (DPP) generates the plasma by discharging the high density current pinch electrical discharge etc., and takes out the EUV light. Because the DDP method differs from the LLP method in construction, the condenser mirror cannot be arranged on the upstream side of a discharge electrode 21 (the plasma emission point is base, the opposite side of the side that the exposure apparatus and the measuring apparatus is attached). A grazing incidence mirror 22 is provided to condense the emitting light from the electrical discharge electrode 21 to the downstream side. Thereby, in the condenser point 6, there expects to be a higher percentage of light elements present other than EUV light elements compared to the LPP method.

Therefore, when the spectrum measuring apparatus according to the present invention is applied to the EUV light source of the DPP method, it is desirable to cover the chamber inner wall 19 with the material that absorbs light easily to prevent the diffuse reflection of the light that is reflected by the pinhole array 1. Moreover, it is also desirable to arrange an antireflection board 23 that coats similar to the chamber inner wall 19 to increase an area that absorbs the light. If the reflection coefficient is about 0.1 or less, these coatings do not harmfully influence the measurement in the wavelength band of the measured light. However, if the reflection coefficient is 0.05 or less, it is more desirable.

Figure 10:
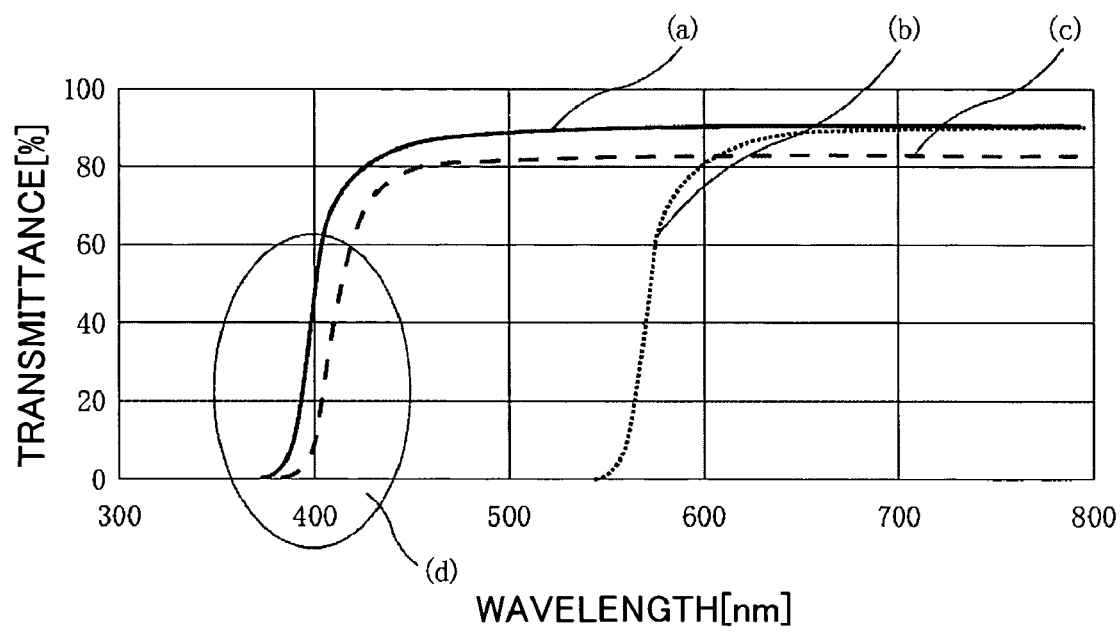
FIG. 10 is a graph that shown a transmittance of a filter used for the spectrum measuring apparatus of the second embodiment according to the present invention.
Figure 11:
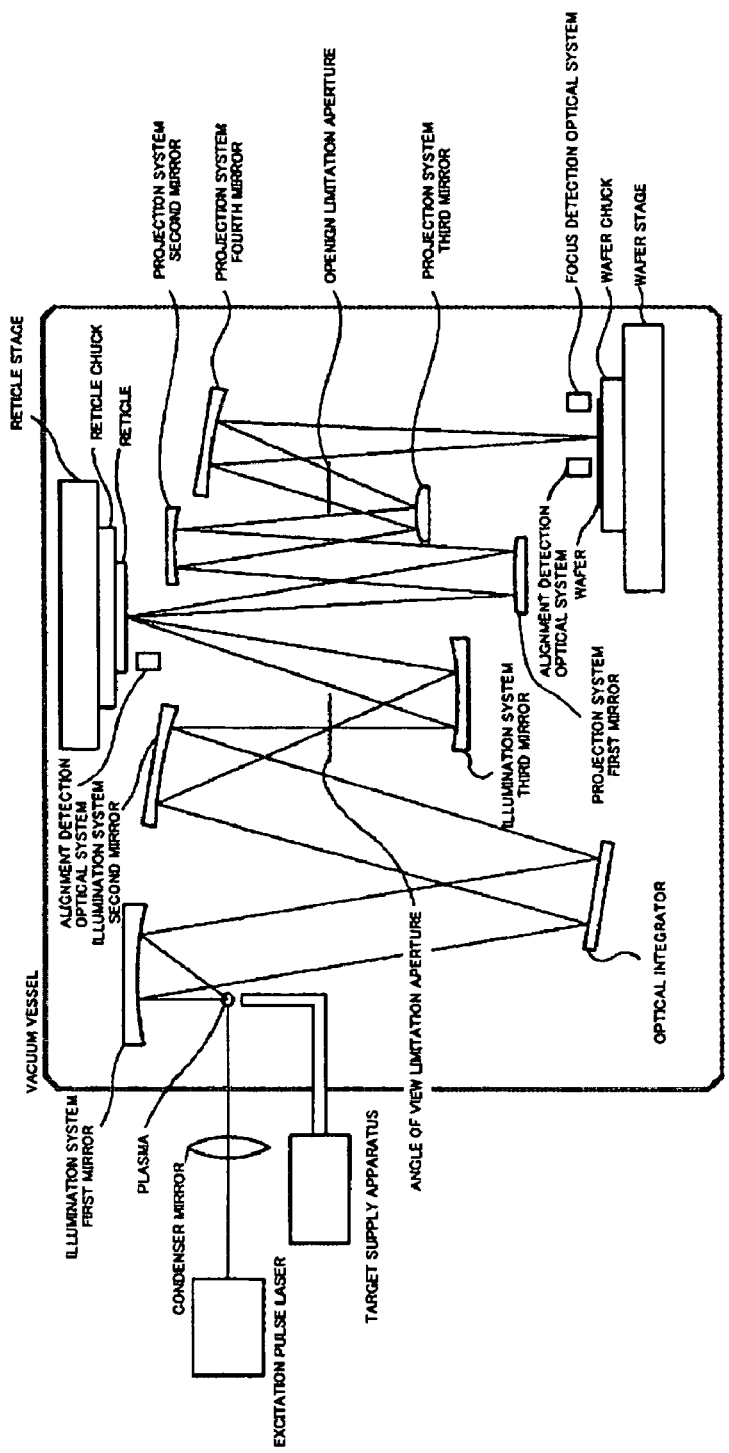
FIG. 11 is a conceptual rendering of an exposure apparatus that uses the EUV light.
Figure 12:
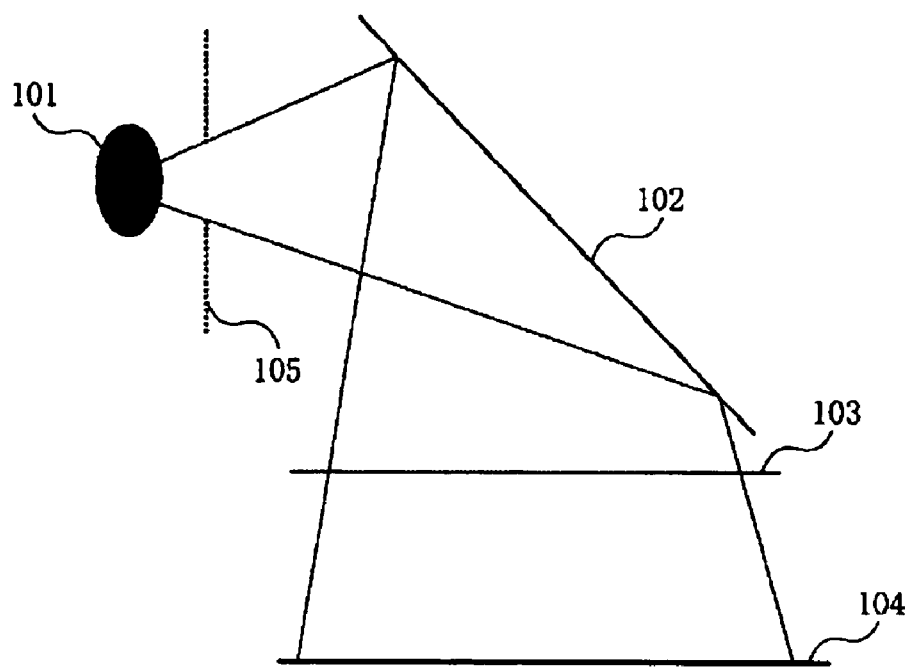
FIG. 12 is one example of a conventional measuring system of an EUV light source.
Figure 13:
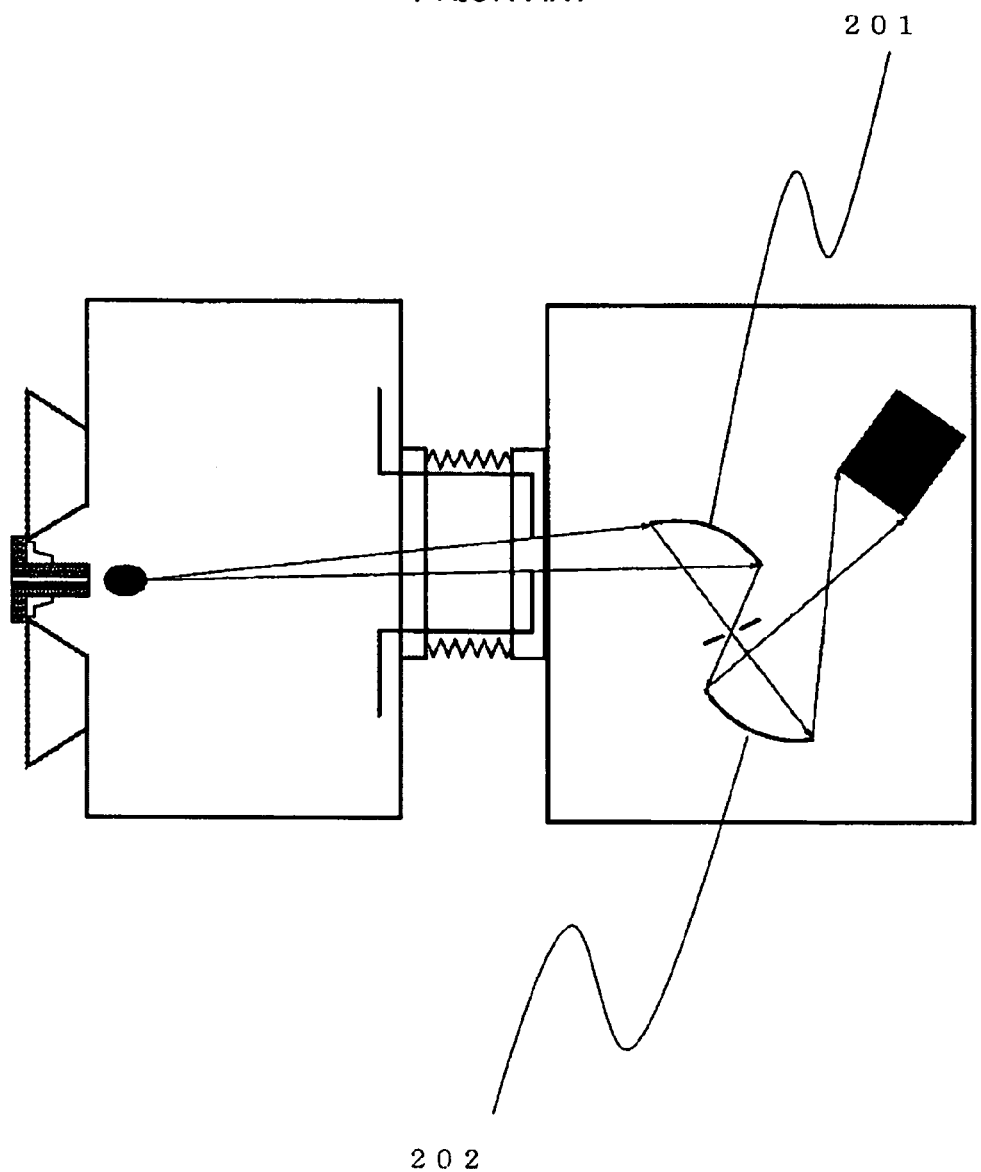
FIG. 13 is an other example of a conventional measuring system of an EUV light source.

Thereinafter, a description will be given of spectrum measuring method by the spectrum measuring apparatus shown in FIG. 9. FIG. 10 shows one example of the transmittance distribution of the spectrum filter that is used by the spectrum measuring apparatus shown in FIG. 9.

For example, when the filter a and filter b are composed of materials that have different absorption ranges, the spectrum measuring apparatus shown in FIG. 9, to similar the first embodiment, can measure the light intensity of a prescribed wavelength region from the difference of the light intensity that the detector 4 detects.

On the other hand, the instant embodiment explains the method of measuring the light intensity of a prescribed wavelength region by using the filter a and a filter c that are composed of the same material, and only thickness is different.

Generally, the transmittance decreases in proportion to the square of thickness when paying attention to the transmittance in the specific wavelength range of the filter composed of a homogeneous material. Therefore, for two different wavelengths, their transmittances will change differently with different filter thicknesses. Especially, in the vicinity of the absorption range of the material that composes the filter, measuring the light intensity of each detailed wavelength region becomes possible by using this.

Concretely, the filter a shown in FIG. 10 has the transmittance of about 90% in 450 nm or more, but the transmittance decreases rapidly in 450 nm or less, becomes about 40% in 400 nm, and becomes substantially opaque in vicinity of 380 nm. On the other hand, when using the filter c that composed of the same material as the filter a and has twice the thickness as filter a, the transmittance of about 81% can be kept in 450 nm or more, and it becomes the transmittance of about 16% in 400 nm. When the thickness of the filter increases, using the phenomenon that the transmittance decreases especially greatly for certain wavelength can form the wavelength filter that has low transmittance. The wavelength filter by such the technique is effective to the wavelength region that the transmittance rapidly changes, and changing the thickness of the filter one by one and measuring can obtain a detailed spectrum.

As mentioned above, obtaining the absolute light intensity in each wavelength region according to the difference of the transmittance caused because the thickness of the filter that uses the material corresponding to the measured wavelength band is switched one by one becomes possible.

This application claims foreign priority benefits based on Japanese Patent Applications No. 2003-299649, filed on Aug. 25, 2003, which is hereby incorporated by reference herein in its entirety as if fully set forth herein.

What is claimed is:

1. A spectrum measuring apparatus for measuring a spectrum of a light including an EUV light from a light source that emits the EUV light, the spectrum measuring apparatus comprising:

an extinction member for selectively decreasing a light intensity of the light from the light source at an extinction rate selected from a plurality of rates;

a wavelength filter for extracting a light with a predetermined waveband from the light having the decreased light intensity, said wavelength filter being detachable from a light path of the light; and a detector for detecting the light intensity of the light within the predetermined waveband, wherein the extinction member has a plurality of openings, and the light from the light source passes through the plurality of openings at the same time.

2. A spectrum measuring apparatus according to claim 1, wherein a diameter of the plurality of openings located in the extinction member is larger than a wavelength of the light for which the light intensity is detected by the detector.

3. A spectrum measuring apparatus according to claim 1, wherein the extinction member, the wavelength filter and the detector are housed by a common vacuum vessel, wherein an inner wall of the vacuum vessel has a reflection coefficient to the light from the light source of 0.1 or less.

4. A spectrum measuring apparatus according to claim 1, wherein said wavelength filter includes first and second wavelength filters that extract light of different wavebands from the light having the decreased light intensity.

5. A spectrum measuring apparatus for measuring a spectrum of a light including an EUV light from a light source that emits the EUV light, the spectrum measuring apparatus comprising:

an extinction member for selectively decreasing a light intensity of the light from the light source at an extinction rate selected from a plurality of rates;

a wavelength filter for extracting a light with a predetermined waveband from the light having the decreased light intensity, said wavelength filter being detachable from a light pass of the light; and a detector for detecting the light intensity of the light within the predetermined waveband as thermal energy.

6. A spectrum measuring apparatus according to claim 5, wherein the detector is calorimeter.

7. A spectrum measuring apparatus according to claim 5, wherein the extinction member, the wavelength filter and the detector are housed by a common vacuum vessel, wherein an inner wall of the vacuum vessel has a reflection coefficient to the light from the light source of 0.1 or less.

8. A spectrum measuring apparatus according to claim 5, wherein said wavelength filter includes first and second wavelength filters that extract light of different wavebands from the light having the decreased light intensity.

* * * * *